(12) United States Patent
Hirayama

(10) Patent No.: US 6,340,919 B1
(45) Date of Patent: Jan. 22, 2002

(54) RANDOM NUMBER GENERATING CIRCUIT

(75) Inventor: Koji Hirayama, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/551,892

(22) Filed: Apr. 19, 2000

(30) Foreign Application Priority Data

Nov. 5, 1999 (JP) ............................................. 11-314660

(51) Int. Cl.[7] ............................. H03B 5/24; H03K 3/00; G06F 1/02
(52) U.S. Cl. ............................. 331/78; 331/57; 708/252; 380/46
(58) Field of Search ............................. 331/78, 105, 57; 708/252; 380/46

(56) References Cited

U.S. PATENT DOCUMENTS

| 3,746,847 A | * | 7/1973 | Maritsas ....................... 331/78 |
| 4,656,369 A | * | 4/1987 | Lou | |

FOREIGN PATENT DOCUMENTS

JP          10-51276         2/1998

* cited by examiner

*Primary Examiner*—Arnold Kinkead
(74) *Attorney, Agent, or Firm*—Volentine Francos, PLLC

(57) ABSTRACT

In a random number generating circuit, a resistive element is arranged between a power supply line which supplies a power voltage and one of a plurality of logic gate circuits. An insulating layer is arranged between the resistive element and a conductive line. As a result, a capacitor is formed between the resistive element and the conductive line, and random numbers can be generated as a result of the capacitance of the capacitor.

13 Claims, 4 Drawing Sheets

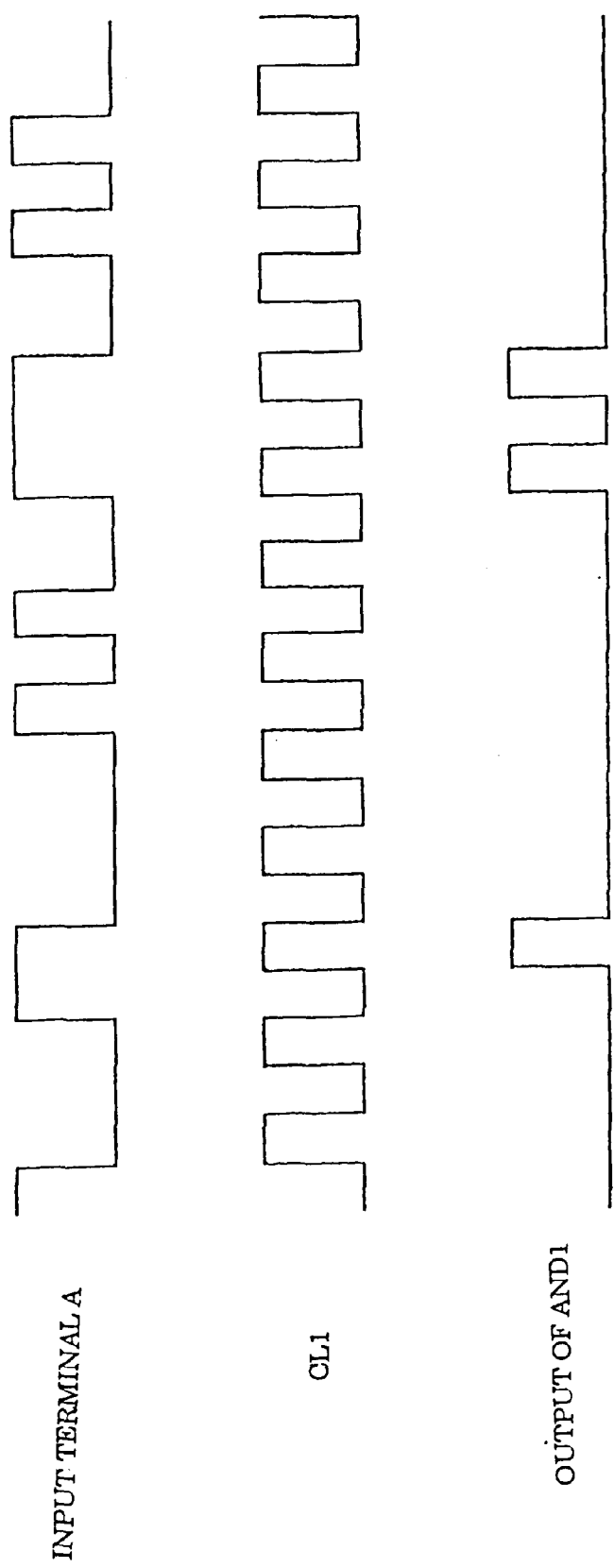

RANDOM NUMBER GENERATING CIRCUIT

FIELD OF THE INVENTION

The present invention relates to a random number generating circuit.

BACKGROUND OF THE INVENTION

An oscillator of a random number generating circuit is comprised of a plurality of logic gate circuits which are connected in series between an input terminal and an output terminal. One output signal of the logic gate circuits is supplied to the input of the oscillator through a feedback line.

A frequency of the oscillator is based on both the logic gate circuits and a delay time caused by conductive lines in the oscillator. The delay time tends to change as a result of environmental temperature variations.

An example is disclosed in Japanese Laid Patent Publication: HEI 10-51276, published on Feb. 20, 1998.

However, in a circuit such as that is disclosed in the noted publication, a large number of the serially connected logic gate circuits is needed to obtain random numbers in a reliable manner. That is, the scale of the oscillator is large.

SUMMARY OF THE INVENTION

The object of the invention is to provide a random number generating circuit which is capable of reliable generating random number without increasing the scale of the oscillator.

To achieve the object, according to one aspect of the invention, in a random number generating circuit, a resistive element is arranged between a power supply line which supplies a power voltage and one of the logic gate circuits. An insulating layer is arranged between the resistive element and a conductive line. That is, a capacitor is formed between the resistive element and the conductive line and the random numbers are based on a capacitance of the capacitor.

According to the present invention, a degree of randomness of the random numbers which are generated from the random number generating circuit is improved without increasing the scale of the oscillator.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG.4 is a timing chart illustrating an outline of operation of the random number generating circuit shown in FIG. 1.

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

Figure 1:
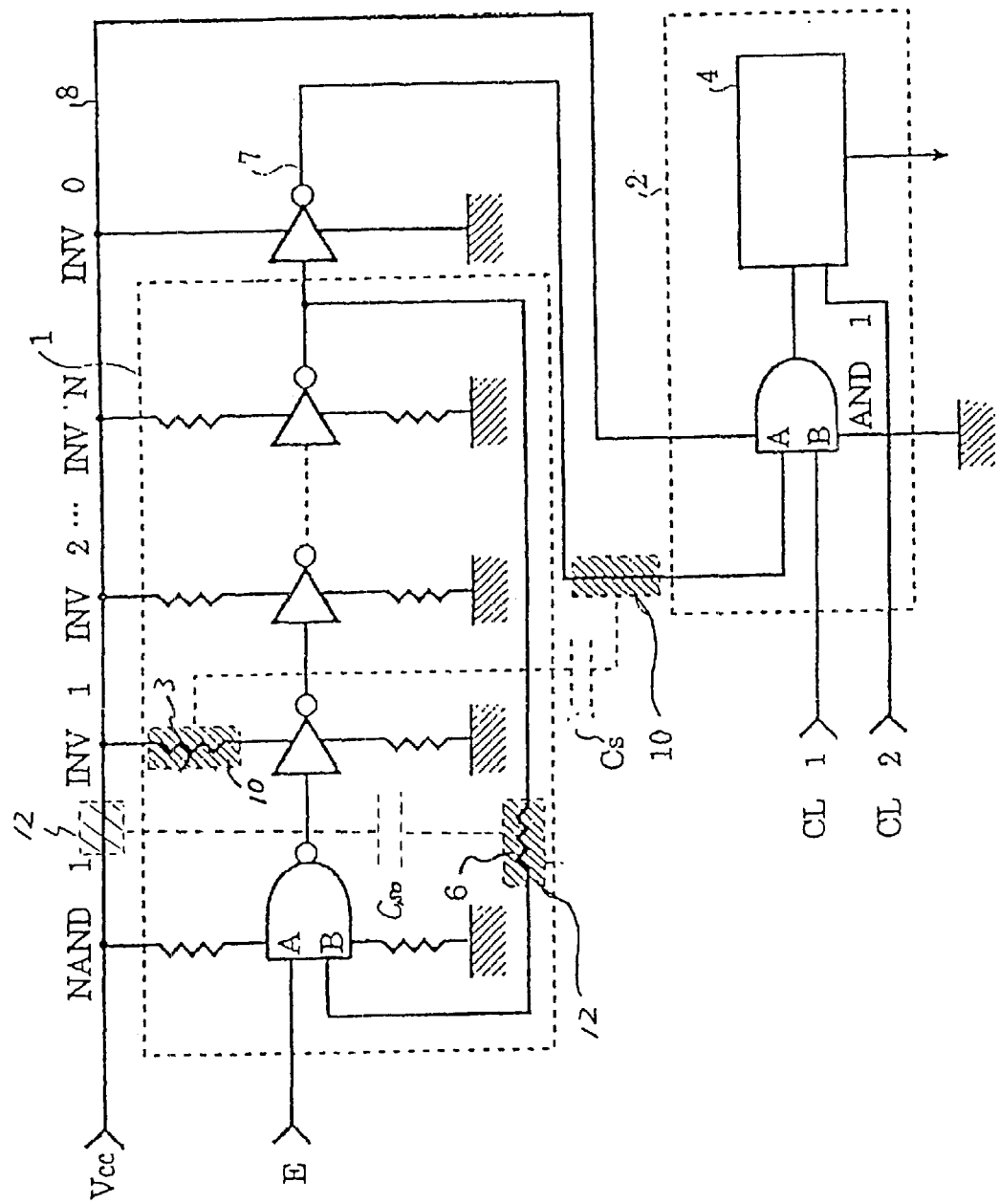
FIG. 1 is a circuit diagram of a random number generating circuit.

FIG. 1 is a random number generating circuit according to the present invention.

The random number generating circuit is comprised of an oscillator 1, a random number output circuit 2 and an inverting amplifier INV0.

The oscillator 1 generates oscillation signals with irregular frequencies and includes a NAND circuit NAND1, N inverting amplifiers INV1 . . . INVN(N is an odd integer), resistive elements 3, 6 and overlapped regions 10.

The NAND circuit NAND1 has two input terminals. One input terminal A receives an enable signal E and the other input terminal B receives an output of the oscillator 1. The oscillator 1 is controlled by the enable signal E. That is, the oscillator is either active or inactive in response to the enable signal E.

The inverting amplifiers INV1 . . . INVN are CMOS type inverters and are connected in series between the output of the oscillator 1 and the NAND circuit NAND1. An input terminal of the inverting amplifier INV1 is connected to an output of the NAND circuit NAND1. An output of the inverting amplifier INVN is the output of the oscillator 1 and is connected to the input terminal B of the NAND circuit NAND1 through a feedback line. The connection between the input terminal B and the output of the oscillator 1 is called a feedback.

The NAND circuit NAND1 and the inverting circuits INV1 . . . INVN are supplied with a power supply voltage through a power supply line 8. The power supply line 8 is supplied with the power supply voltage from a power supply Vcc. Also, a ground voltage is supplied to the NAND circuit NAND1 and the inverting circuits INV1 . . . INVN through a ground line.

The power supply and the ground voltage are applied from outside the random number generating circuit, and these voltages are used to drive the elements in this circuit.

The resistive element 3 is arranged between the inverting amplifier INV1 and the power supply line 8 and has a predetermined resistance. Also, the resistive element 3 can be arranged between the inverting amplifier INV1 and the ground line. As shown in FIG. 1, two resistive elements can be provided.

The resistive element 3 is a resistor which receives a noise that occurs in the vicinity thereof and provides a change of the power supply in response to the noise to the inverting amplifier INV1.

As mentioned above, the resistive element 3 has the predetermined resistance. According to experiments by an inventor, the predetermined resistance is more than 100 KΩ. In the description to follow, a resistance of the resistive element is 1M Ω.

The explanation mentioned above is for the inverting amplifier INV1. A similar explanation can also be applied to the NAND circuit and other inverting amplifier INV2 . . . INVN.

The resistive element 6 is a resistor which is arranged in the feedback line and adjusts to the output of the oscillator 1. The resistive element 6 receives a noise that occurs in the vicinity thereof and provides a feedback to the NAND circuit NAND1.

The overlapped regions 10 and 12 are formed by overlapping the resistive elements 3 and 6 which are formed over a semiconductor substrate with different conductive lines, such as the output 7 of the inverting amplifier INV0 and the power supply line 8, respectively through an insulating layer, such as a silicon dioxide layer and silicon nitride layer.

Here, an explanation the overlapped region 10 will be described, referring to FIG. 2.

Figure 2:
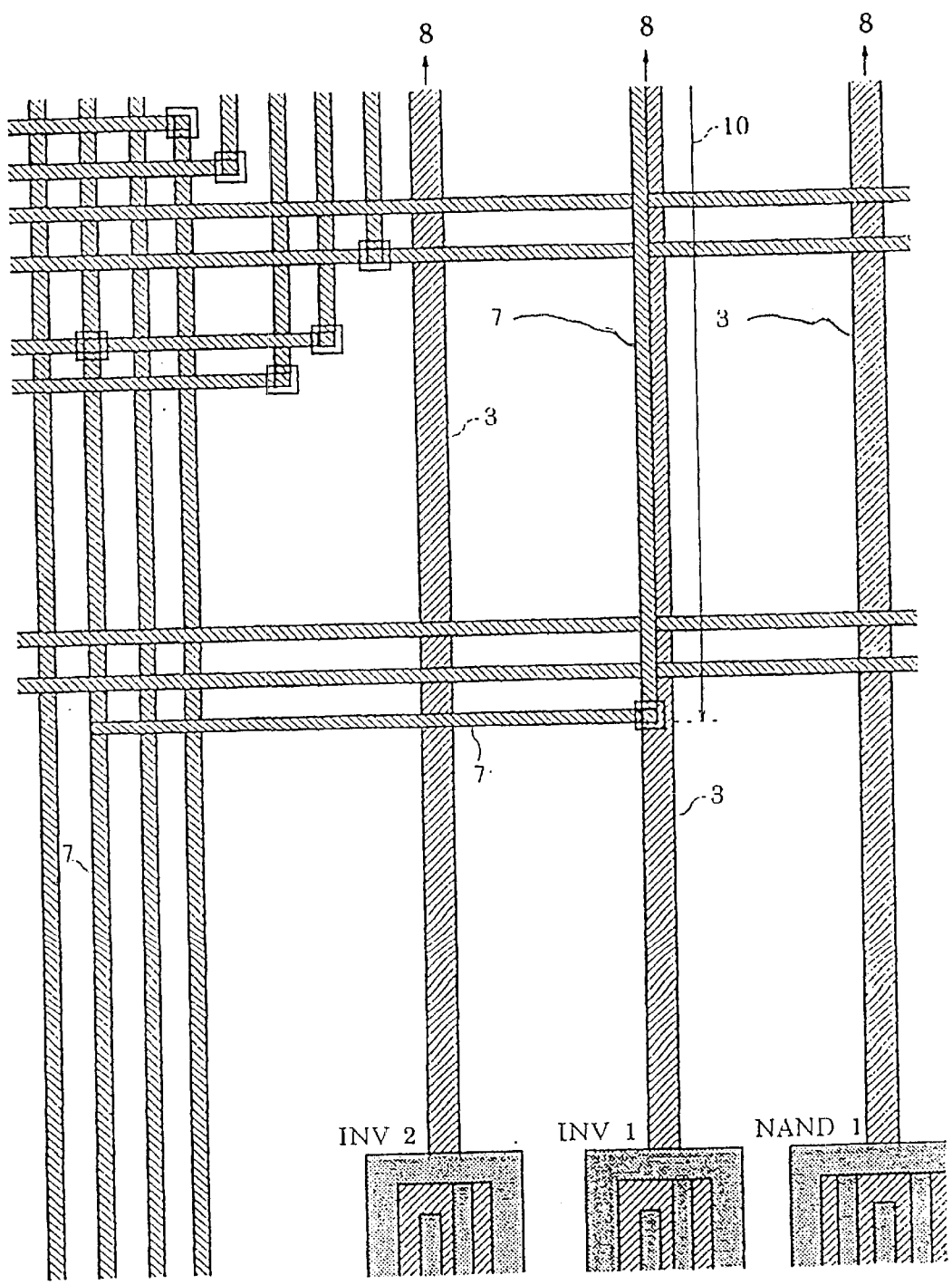
FIG.2 is a partial pattern layout of an oscillator.

FIG. 2 is a partial pattern layout of an oscillator 1. In FIG. 2, a partial pattern of the NAND circuit NAND1, the inverting amplifiers INV1, INV2 and the resistive element 3 is shown. Other patterns which are not shown in FIG. 2 will be understood easily with reference to the description hereinafter.

In FIG. 2, an output line 7 of the inverting amplifier INV0 is arranged over a pattern of the resistive element 3 through an insulating layer (not shown). The pattern of the resistive layer 3 connects the inverting amplifier INV1 with the power supply 8. The pattern of the resistive layer 3 and the output line 7 extend in the same direction in the overlapped region 10. In the overlapped region 10, a capacitor Cs (FIG. 1) which has a predetermined capacitance is formed between the resistive element 3 and the output line 7. The capacitor Cs is a parasitic capacitor.

In this embodiment, the overlapped region 10 is formed on the resistive element 3 between the inverting amplifier INV1 and the power supply line 8.

Similarly, such an overlapped region can be arranged between the NAND circuit NAND1 or the inverting amplifier INV2 and the power supply line 8 or the ground line. Naturally, such an overlapped region can be arranged between the other inverting amplifiers and the power supply line 8 or the ground line.

The arrangement of the overlapped regions, such as a number or the location thereof, can be considered by a designer.

Figure 3:
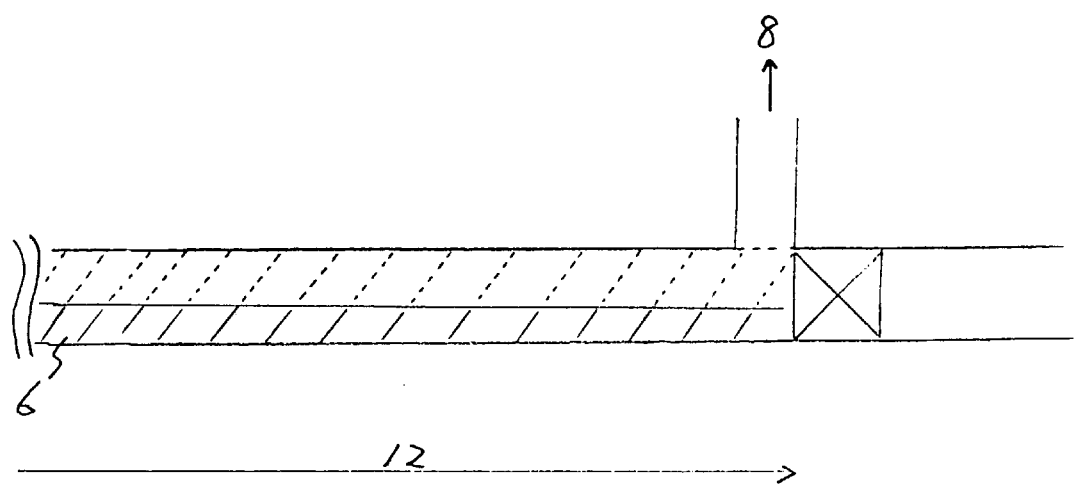
FIG.3 is a partial pattern layout of a second overlapped region.

In the case where the overlapped region 12 is formed by the resistive element 6 in the feedback line and the power supply line 8, the description mentioned above can be referenced. The overlapped region 12 is shown in FIG. 3.

Referring to FIG. 1 again, the random number output circuit 2 converts the oscillation signals having irregular frequencies from the oscillator 1 into random numbers and is comprised of an AND circuit AND1 and a counter 4.

The AND circuit AND1 has two input terminals. One input terminal A receives the oscillation signals from the oscillator 1 through the output line 7 and the other input terminal B receives a clock signal CL1 from an external device (not shown). An AND circuit is used in this embodiment, but an OR circuit and exclusive OR circuit can also be used.

The counter 4 is a n-counter and converts an output from the AND circuit AND1 into random numbers and outputs the random numbers. A counter can be selected by the designer according to an equipment which is applied to the random number generating circuit of the present invention.

The inverting amplifier INV0 connects the oscillator 1 with the random number output circuit 2 and functions as a buffer. The output line 7 is a conductive line which is arranged between the inverting amplifier 7 and the random number output circuit 2. A portion of the output line 7 and the resistive element 3 cause the capacitance Cs therebetween in the overlapped region 10.

Here, an outline of operation of the random number generating circuit illustrated in FIG. 1 will be described.

In this operation, it is presumed that (1) a overlapped region are formed between the resistive element 3 connected to the inverting amplifier INV1 and the output line 7, and a second overlapped region is formed between the resistive element 6 in the feedback line and the power line 8, (2) the NAND circuit NAND1 begins to operate and outputs a "Low-level" signal ("L" signal) in response to the enable signal E and a "High-Level" signal ("H" signal), (3) a noise Vn1 occurs on the line between the power line 8 and the inverting amplifier INV1.

If noise does not occur, the output of the NAND circuit NAND1 keeps the "L" signal during a regular period which is defined by the delay time To of the inverting amplifiers INV1 ... INVN and the NAND circuit NAND1 and a feedback time for the feedback.

However, if noise Vn1 occurs on the power line or on the line between the power line 8 and the inverting amplifier INV1, the noise Vn1 travels to the input terminal B of the NAND circuit NAND1 through the capacitor Cso and the resistive element 6. Simultaneously, the delay time of the inverting amplifier INV1 is changed by the movement of the power voltage. Naturally, the power voltage which is supplied to the inverting amplifier INV1 is changed by the noise Vn1.

Therefore, the input terminal B of the NAND circuit NAND1 receives an "L" signal and the output of the NAND circuit NAND1 outputs an "H" signal after an irregular delay time Td which is different from the delay time To. Similarly, such transition travels to the input terminal B of the NAND circuit NAND1 through the inverting amplifiers INV1 ... INVN and the feedback line upon receiving the influence of the noise Vn1. Thus, the oscillator 1 starts to generate the oscillation signal.

The oscillation signal generated by the oscillator 1 is outputted to the random number output circuit 2 through the output line 7. That is, the oscillation signal passes through the overlapped regions 10 and 12.

Consequently, the transition of the output from the oscillator 1 on the output line 7 becomes on-off noise Ns. This on-off noise Ns travels to the resistive element 3 through the capacitor Cs. In addition, the irregular delay time Td is changed even more. So, the frequency of the oscillation signal becomes irregular. That is, random numbers can be reliably generated.

In this embodiment, the changing of the inverting amplifier INV1 occurs as a result of the noise Vn1, such as an electromagnetic noise, and the on-off noise Ns. In fact, another electromagnetic noise which is caused by other parasitic capacitors can influence the inverting amplifier INV1 directly. So, the irregularity of the oscillation signal is actually larger than that of the description.

The longer the length of the overlapped regions 10 and 12, the larger the noise influence on the inverting amplifier INV1.

The operation of the random number output circuit 2 will be described hereinafter with reference to the timing chart shown in FIG. 4.

In FIG. 4, waveforms of the input terminal A of the AND circuit AND1 (the output of the oscillator), the clock signal CL1(the input terminal B of the AND circuit AND1) and the output of the AND circuit AND1 are described.

The AND circuit AND1 outputs the output signal to the counter 4 when the output of the oscillator 1(the input terminal A) and the clock CL1 are at a "High-Level" together. That is, the output of the AND circuit AND1 is synchronized with the clock signal CL1.

The counter 4 counts the output from the AND circuit AND1. The result of counting is converted into numbers and is outputted to an external equipment (not shown) in response to the clock signal CL2. That is, this number is a random number.

The operation of the random number output circuit 2 is synchronized with the clock signal CL1, even if the output of the oscillator 1 is irregular. So, by setting the clock signal CL1, undesirable outputs from the oscillator are not inputted to the counter. Therefore, the output from the oscillator can be counted selectively based on a clock signal which is set at a desirable condition in advance. As the counter does not count beyond the setting, the operation of the counter becomes stable.

Thus, the random number generating circuit of the present invention generates random numbers as a result of noises which occur in the conductive lines and the logic gate circuit.

According to the present invention, a randomness of the random numbers which are generated from the random number generating circuit can be improved without increasing the scale of the oscillator.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A random number generating circuit comprising:
    an oscillator circuit which is comprised of a plurality of logic gate circuits and has an input terminal and an output terminal, wherein the logic gate circuits are connected in series between the input terminal and the output terminal, and wherein an output one of the logic gate circuits is connected to the input terminal;
    a power supply line which supplies a power supply;
    a resistive element which is connected between the power supply line and one of the logic gate circuits;
    a conductive line which is supplied with a signal; and
    a capacitive element which is formed by the resistive element and the conductive line through an insulating layer wherein random numbers are provided based on capacitance of the capacitive element.

2. The random number generating circuit according to claim 1, wherein the conductive line is connected to the output terminal of the oscillator via a buffer circuit.

3. The random number generating circuit according to claim 2, further comprising at least one other conductive line and at least one additional resistive element which is connected between the power supply line and one other of the logic gate circuits, wherein the additional resistive element overlaps at least one of the conductive line, the power supply line or the at least one other conductive line through the insulating layer.

4. The random number generating circuit according to claim 1, wherein a resistance of the resistive element is more than 100 KΩ.

5. The random number generating circuit according to claim 3, wherein resistance of each of the resistive elements is more than 100 KΩ.

6. The random number generating circuit according to claim 1, wherein a frequency of oscillation of said oscillator circuit is dependent upon a capacitance of said capacitive element.

7. A random number generating circuit comprisng:
    an oscillator which has an input terminal and an output terminal and is comprised of at least first and second inverters connected in series between the input terminal and the output terminal, wherein an output terminal of the second inverter is connected to an input of the first inverter through a feedback line;
    a power supply line which supplies a power supply;
    a first resistive element which is connected between the power supply line and the first inverter;
    a conductive line; and
    a capacitive element which is formed by the first resistive element and the conductive line through an insulating layer wherein random numbers are provided based on capacitance of the capacitive element.

8. The random number generating circuit according to claim 7, wherein the conductive line is coupled to the output terminal of the oscillator via a buffer circuit.

9. The random number generating circuit according to claim 8, further comprising a second resistive element contained in the feedback line, and wherein the second resistive element overlaps the power supply line through the insulating layer.

10. The random number generating circuit according to claim 7, wherein the first resistive element overlaps and extends in a same direction as the conductive line.

11. The random number generating circuit according to claim 7, wherein a frequency of oscillation of said oscillator circuit is dependent upon a capacitance of said capacitive element.

12. A random number generating circuit comprising:
    an oscillator which has an input terminal and an output terminal and is comprised of at least first and second inverters connected in series between the input terminal and the output terminal, wherein an output terminal of the second inverter is connected to an input of the first inverter through a feedback line;
    a power supply line which supplies a power supply;
    a first resistive element contained in the feedback line; and
    a capacitive element which is formed by the first resistive element and the power supply line through an insulating layer wherein random numbers are provided based on capacitance of the capacitive element.

13. The random number generating circuit according to claim 12, further comprising a second resistive element which is connected between the power supply line and the first inverter, a conductive line and wherein the second resistive element overlaps the conductive line through the insulating layer.

* * * * *